US007042214B2

(12) United States Patent
Cunningham et al.

(10) Patent No.: US 7,042,214 B2
(45) Date of Patent: May 9, 2006

(54) NON-LINEAR SYMMETRIC SWEEP SPECTRAL-SPATIAL RF PULSES FOR MR SPECTROSCOPY

(75) Inventors: Charles H. Cunningham, San Francisco, CA (US); John M. Pauly, Redwood City, CA (US); Daniel B. Vigneron, Corte Madera, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 87 days.

(21) Appl. No.: 10/823,979

(22) Filed: Apr. 13, 2004

(65) Prior Publication Data

US 2005/0225323 A1 Oct. 13, 2005

(51) Int. Cl.
*G01V 3/00* (2006.01)
(52) U.S. Cl. .................................... 324/307
(58) Field of Classification Search ........ 324/300–322; 600/410–435; 333/196, 219–325; 345/418–475; 375/130–337
See application file for complete search history.

(56) References Cited

U.S. PATENT DOCUMENTS

| | | | | |
|---|---|---|---|---|
| 4,760,336 A | | 7/1988 | Conolly ...................... | 324/309 |
| 4,910,483 A | * | 3/1990 | Mitchell et al. ............. | 333/196 |
| 4,940,940 A | | 7/1990 | Leroux ....................... | 324/309 |
| 5,168,229 A | | 12/1992 | Hurd et al. .................. | 324/309 |
| 5,189,371 A | * | 2/1993 | Conolly et al. ............. | 324/309 |
| 5,402,067 A | * | 3/1995 | Pauly et al. ................. | 324/307 |
| 5,499,629 A | * | 3/1996 | Kerr et al. ................... | 600/410 |
| 5,572,126 A | * | 11/1996 | Shinnar ....................... | 324/314 |
| 6,028,428 A | | 2/2000 | Cunningham et al. ...... | 324/314 |
| 6,069,478 A | | 5/2000 | Hurd .......................... | 324/307 |
| 6,304,084 B1 | * | 10/2001 | Star-Lack et al. ........... | 324/307 |

OTHER PUBLICATIONS

Charles et al.; "High-Order Multiband Encading in the Heart"; Magnetic Resonance in Medicine 48, (2002), pp 689-698.*

Hurd et al.; "Design of Symetric-Sweep Spectral-Spatial RF Pulses for Spectral Editing"; Magnetic Resonance in Medicine 52, (2004), pp 147-153.*

(Continued)

Primary Examiner—Diego Gutierrez
Assistant Examiner—Dixomara Vargas
(74) Attorney, Agent, or Firm—Beyer Weaver & Thomas LLP

(57) ABSTRACT

A method for designing non-linear phase 180° spectral-spatial radio frequency pulses that can be used for spectral editing in magnetic resonance spectroscopic imaging. A novel feature of the pulse is a symmetric sweep developed by the spectral profile from the outside edges of the spectral window towards the middle whereby coupled components are tipped simultaneously and over a short interval. Pulses have been designed for lactate editing at 1.5T and 3T. The spectral and spatial spin-echo profiles of the RF pulses can be measured experimentally and altered in an iterative manner. Spectral-spatial radio frequency (SSRF) pulses allow simultaneous selection in both frequency and spatial domains. These pulses are particularly important for clinical and research magnetic resonance spectroscopy (MRS) applications for suppression of large water and lipid resonances.

15 Claims, 10 Drawing Sheets

OTHER PUBLICATIONS

Charles et al.; "Sequence Design for Magnetic Resonance Spectroscopic Imaging of Prostate Cancer at 3T"; Magnetic Resonance in Medicine 53, (2005), pp. 1033-1039.*

Conolly et al., *"Variable Rate Selective Excitation"*, Journal of Magnetic Resonance, vol. 78, 440-458, 1988.

Cunningham et al., *"Design of Symmetric-Sweep Spectral-Spatial RF Pulses for Spectral Editing"*, Magn Reson Med. Jul. 2004;52 (1):147-53.

Cunningham et al., *"Symmetric-Sweep Spectral-Spatial RF Pulses for Spectral Editing"*, May 2004, 1 page.

Star-Lack et al., *"In Vivo Lactate Editing with Simultaneous Detection of Choline Creatine, NAA, and Lipid Singlets at 1.5 T Using PRESS Excitation with Applications to the Study of Brain and Head and Neck Tumors"*, Journal of Magnetic Resonance, vol. 133, 243-254, 1998.

\* cited by examiner

NON-LINEAR SYMMETRIC SWEEP SPECTRAL-SPATIAL RF PULSES FOR MR SPECTROSCOPY

GOVERNMENT RIGHTS

The U.S. government has rights to the disclosed invention pursuant to NIH Contract No. R01CA059897 with Stanford University.

BACKGROUND OF THE INVENTION

This invention relates generally to magnetic resonance spectroscopy and more particularly, the invention relates to RF pulses for use in spectral editing in MR spectroscopy.

Spectroscopic imaging is a combined spatial/spectral imaging where the goal is to obtain a MR spectrum at each spatial position or to display an image of each chemical shift species at each position. Chemical shift is a subtle frequency shift in a MR signal that is dependent on the chemical environment of a particular compound or metabolite. The chemical shift is a small displacement of resonant frequency due to a shielding dependent on chemical environment and created by the orbital motion of surrounding electrons in response to a main magnetic field, $B_0$.

As described in Cunningham et al., U.S. Pat. No. 6,028,428, there are numerous pulse sequences used in MRI and in NMR spectroscopy. These pulse sequences use at least one, and usually more than one, RF pulse near the Larmor frequency. In addition to the RF excitation pulse mentioned above, such RF excitation pulses may, for example, invert spin magnetization, saturate spin magnetization, stabilize spin magnetization or refocus spin magnetization. When used in combination with a magnetic field gradient, the RF pulses selectively affect spin magnetization over a specific frequency range which corresponds to a specific location within the subject being scanned. Such "selective" RF pulses are thus specified by the degree to which they tip magnetization ("flip angle") over a range of frequencies.

In U.S. Pat. No. 4,940,940, a method is disclosed for designing RF pulses that will produce a desired flip angle over a specified frequency range. The disclosure of this patent is hereby incorporated by reference. This method, known in the art as the "SLR" method, starts with the desired frequency domain pulse profile (for example, a 90° flip angle over a specified slice thickness/frequency range) and calculates the amplitude and phase of a RF pulse, that when played out over time, will produce the desired result. These calculations involve the approximation of the desired frequency domain pulse profile with two high order polynomials A and B which can then be transformed directly into a RF pulse that is "played out" on an NMR system. The step of producing the polynomials A and B employs a Remez (Parks-McClellan) algorithm that is executed in an iterative process. To calculate the necessary A and B polynomials (hereinafter referred to as the "SLR polynomials") this iterative process is performed until the desired frequency domain pulse profile is approximated to a specified degree of accuracy.

The use of spectral-spatial EPSE (echo-planar spin-echo) pulses within pulse sequences for MR spectroscopic imaging is an attractive option, as the high bandwidth of the sub-pulses (5–10 kHz) greatly reduces the error associated with chemical-shift misregistration. However, exciting the spectral bandwidth needed to measure a typical set of metabolites (e.g., 300 Hz at 3T), along with an adequate spatial profile, requires high RF amplitude. The amplitude can be brought down into practical range using a RF pulse that excites a profile with non-linear phase but such pulses are inappropriate for J-difference editing of metabolites, such as lactate and GABA.

For editing, it is crucial that the coupled components are flipped simultaneously, and over a short interval. The problem is that a non-linear phase RF pulse affects different resonant frequencies at different times during the RF pulse. These pulses perform poorly for J-difference editing because the coupled components, which have different frequencies, are tipped by the pulse at different times. This causes the spin-echo and J-echo to occur at slightly different times, leading to errors in quantitation.

The present invention provides a new RF pulse design method to enable the use of spectral-spatial RF pulses for J-difference editing in magnetic resonance spectroscopic imaging (MRSI).

SUMMARY OF THE INVENTION

In accordance with the invention, the design of a non-linear RF pulse having symmetric sweep is provided. In one application, the RF pulse is applied to magnetic resonance spectroscopic imaging (MRSI) and particularly to symmetric sweep spectral-spatial RF pulses for use in spatially resolved measurement of a metabolite (e.g., lactate) in vivo.

In designing the RF pulse, initial design choices of pulse duration and gradient oscillation frequency are chosen, and a beta-polynomial is then designed for the spectral dimension. The polynomial roots are computed and plotted in a complex plane, and then a subset of the roots is flipped to a new position in the complex plane both inside and outside the unit circle.

The new roots are then combined to give a non-linear phase beta-polynomial. The non-linear beta-polynomial and a beta-polynomial for a slice (spatial) are applied to an inverse SLR transform to compute the RF waveform. Finite gradient ramp times are compensated as necessary, and then performance of the pulse design is evaluated. The root pattern of the spectral beta-polynomial is changed if the spectral time-course needs altering. If the root pattern is changed, the steps above for the non-linear phase beta-polynomial are repeated.

While the pulse design is particularly useful for refocusing pulses in echo-planar spin-echo sequences, the pulse design can be applied to any symmetric sweep spectral-spatial pulse.

The invention and object and features thereof will be more readily apparent from the following detailed description and appended claims when taken with the drawings.

DETAILED DESCRIPTION OF ILLUSTRATED EMBODIMENTS

Figure 1:
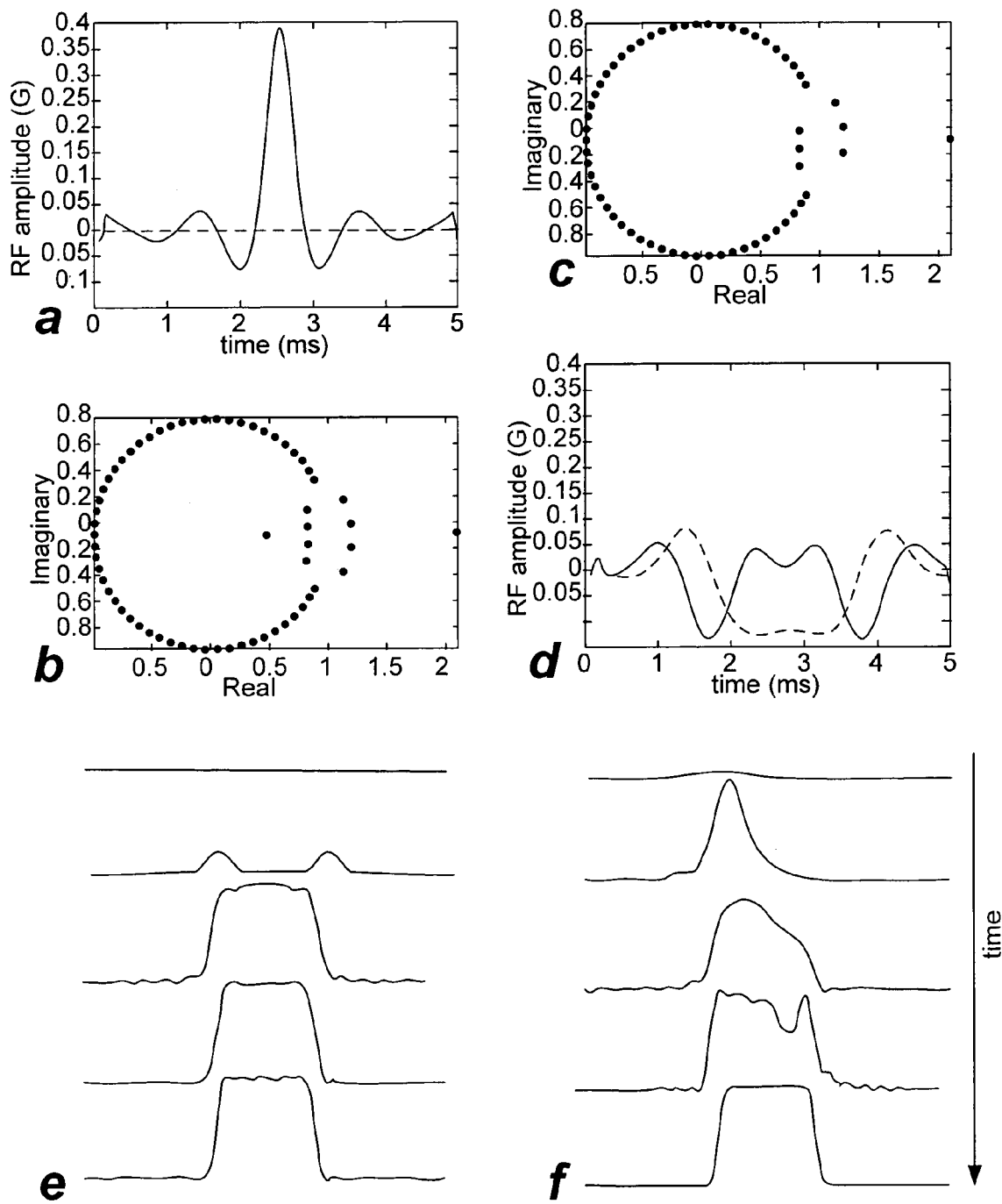
FIGS. 1a–1f illustrate reduction of peak RF $B_1$ magnetization by non-linear RF phase modulation.

Spectral-spatial radio frequency (SSRF) pulses allow simultaneous selection in both frequency and spatial domains. These pulses are particularly important for clinical and research magnetic resonance spectroscopy (MRS) applications where suppression of the large water resonance and, for some applications, lipid resonances, is critical. The use of SSRF pulses allows the incorporation of the suppression of unwanted resonances directly into the excitation scheme without the need for suppression pre-pulses. With pre-pulse suppression schemes such as CHESS, the level of suppression is sensitive to T1 and RF field variations, and the long duration of the pre-pulses limits the performance of out-of-volume saturation. The use of SSRF pulses for MR spectroscopic imaging (MRSI) is also advantageous due to the high bandwidth of the sub-pulses (5–10 kHz) which greatly reduces the spatial-shift errors associated with the different resonant frequencies within the imaging volume. These errors become worse at higher main-field strengths where the frequency difference between different chemical-shift species is larger and susceptibility effects are amplified.

However, the use of high-bandwidth sub-pulses along with enough spectral bandwidth to measure a typical range of metabolite frequencies (e.g., 300 Hz at 3T) can require RF amplitudes beyond the limits of the RF amplifier of a typical scanner. The amplitude can be reduced to practical values using a RF pulse that excites a profile with non-linear phase. However, non-linear phase RF pulses are problematic for the measurement of coupled spins, such as the protons in lactate. Lactate has been observed in ischemic tissue, notably brain tumors, and is thought to correlate with non-oxidative glycolysis. In most cases, the CH3 (1.3 ppm) component of lactate cannot be measured directly because lipid is present at the same resonant frequency. However, by alternately including and excluding the 4.1 ppm component of lactate from the spectral band of the refocusing pulses(s), the polarity of the 1.3 ppm peak can be made to alternate, enabling separation of lactate from lipid by subtraction. This scheme, which requires a particular echo time of $1/(2J)$ (144 ms), is known as lactate editing.

For editing, it is crucial that the coupled components are tipped simultaneously and over a short interval ($<<1/J$). The problem is that, by its nature, a non-linear phase RF pulse affects different resonant frequencies at different times during the RF pulse. These pulses perform poorly for J-difference editing because the coupled components, which have different frequencies, are tipped by the pulse at different times. This causes the refocusing of main-field inhomogeneities and the J-modulation to occur at slightly different times, leading to errors in quantification.

The present invention provides a new method for designing non-linear phase 180° SSRF pulses that can be used for spectral editing. The novel feature of the pulses is that the spectral profile develops as a symmetric sweep, from the outside edges of the spectral window towards the middle, so that coupled components are tipped simultaneously and over a short interval. The method has particular utility with MRSI applications, but the method can be used in RF pulse design in general.

Non-linear phase modulation has become an important tool in RF pulse design for enabling the use of pulses with shorter duration, while keeping the peak amplitude within the limits of the RF amplifier. The amplitude of these pulses is spread much more evenly over the pulse duration in comparison to conventional, linear phase pulses which are strongly peaked. Likewise, the tipping of magnetization caused by a non-linear phase pulse is also spread out over the duration of the pulse and this causes problems when applied to coupled spins, such as the protons in lactate. FIG. 1 illustrates reduction of peak B1 by non-linear phase modulation. This conventional sync-like 180° pulse (a) has a beta-polynomial root pattern (b) that is characteristic of the Parks-McClellan filter design algorithm used within the SLR design process. By flipping some of the roots across the unit circle as is indicated by the arrows in (b), a new root pattern is created (c). The resulting RF pulse (d) has a peak amplitude reduced by 65% relative to (a). A magnitude plot of the spin-echo profile at intermediate points within the pulse shows how the time-course is altered by root flipping. The time-course for the pulse in (a) shows a typical time-course, with most of the pulse affecting only the edges, and the bulk of the tipping happening at the midpoint (e). In contrast, the time-course for the pulse in (d) shows an atypical pattern, with the left side of the profile being tipped before the right.

In accordance with the invention, a method is provided for designing spectral-spatial RF pulses with non-linear phase in the spectral dimension. In one embodiment, the pulses can be 180° refocusing pulses, which provide spin-echo profiles instead of the more common excitation profile. The novel feature of the new pulses is that the tipping caused by the pulse acts on coupled components simultaneously and over a short time interval ($<1/J$).

The Shinnar-Le Roux (SLR) transform (J. Pauly, P. Le Roux, D. Nishimura, A. Macovski, "Parameter relations for the Shinnar-Le Roux Selective Excitation Pulse Design Algorithm," *IEEE Transactions on Medical Imaging* 10, 53–65 (1991)) maps the discrete RF pulse waveform samples $B_1(t_i)$ to two polynomials, $A_n(z)$ and $B_n(z)$, as follows:

$$B_1(t_i) \Longleftrightarrow A_n(z), B_n(z) \quad (1)$$

The transform is useful because the coefficients of $B_n(z)$ are related to the spin-echo profile by the Fourier transform. As described by Pickup et al., (S. Pickup, X. Ding, "Pulses with Fixed Magnitude and Variable Phase Response Profiles," *Magnetic Resonance in Medicine* 33, 648–655 (1995)), a whole family of non-linear phase RF pulses can be derived from a conventional linear phase pulse. This is done by computing $B_n(z)$, factoring the roots of the polynomial, and plotting them in the complex plane. The roots that are within the excitation profile are typically located at the radius $\pm 1/N$ where N is the number of samples in the RF pulse. By flipping a subset of these roots to a new location, along the same radius, but to new radial distance $1/r_0$, where $r_0$ is the original radial distance, new RF pulses can be generated that have the same magnitude excitation profile, but drastically different phase profiles.

The new method is described below within the context of two-dimensional RF pulse design using the SLR transform.

The new method relates to the design of the Bn(z) coefficients for the spectral dimension, whose Fourier transform corresponds to the spectral spin-echo profile. The following design process is typically iterated a few times to fine-tune the result. One iteration is described first; the method for evaluating the performance of the pulse and refining the design is explained later herein.

Beta-Polynomial Design

The design begins with a choice for the net duration of the RF pulse, and the frequency at which the slice-select gradient will be oscillated. These two parameters determine the number of sublobes, and thus the number of beta-polynomial coefficients for the spectral dimension (N). The time-bandwidth product for the spectral dimension (TB) is computed by multiplying the desired spectral bandwidth of the pulse by the pulse duration.

Figure 2:
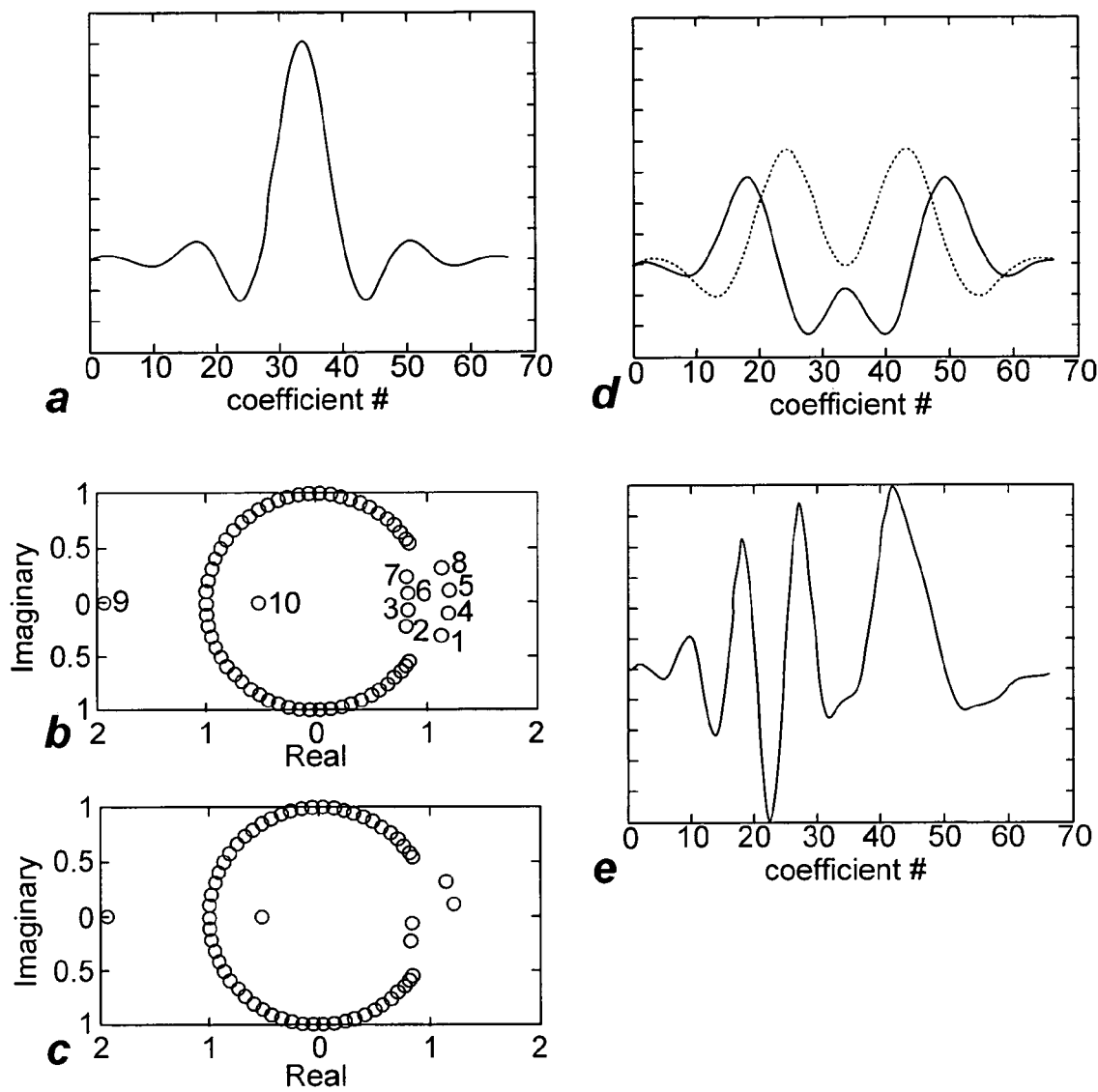
FIGS. 2a–2e illustrate design of a symmetric sweep beta-polynomial for lactate editing at 3T ($B_0$).

Next, the Parks-McClellan digital filter design algorithm (R. N. Bracewell, "The Fourier Transform and its Applications," McGraw-Hill Book Company, New York, 1986) is used to design a beta-polynomial for the spectral dimension. See FIG. 2 which illustrates design of a symmetric sweep beta-polynomial for lactate editing at 3T. (a) A conventional, linear phase beta-polynomial is designed. The bandwidth is set to one-half of that necessary to encompass the 1.3 ppm and 4.1 ppm components of lactate at 3T, with a ±25 Hz tolerance (230 Hz). (b) The roots of the beta-polynomial are factored and plotted in the complex plane. (c) A subset of the roots are flipped across the unit circle, so that approximately half of the passband contains roots inside the circle, and the other half contains roots outside. (d) A non-linear phase beta-polynomial is computed from the new root pattern. (e) Using Eq. 2 below, the symmetric sweep beta-polynomial is computed from that shown in (d).

The inputs to the algorithm are the number of coefficients (N), the time-bandwidth product TB/2 (this beta-polynomial is actually for one-half of the spectral band), and weighting factors for the in-band and out-of-band ripple optimization (typically used is 1000:1 weighting in favor of the out-of-band ripple). This results in a conventional, sync-like filter (FIG. 2a). It should be noted that instead of a linear phase filter, a "minimum phase" filter can be used. Although minimum phase filters offer the advantages of smaller profile ripples and sharper transition regions (for a given TB), their use requires a slightly more complicated design process. This will be described later herein below.

The polynomial roots of the set of filter coefficients are computed and plotted in the complex plane (FIG. 2b). Labels are placed on each of the roots in the passband, as is done in FIG. 2b, so that the designer is able to specify particular roots to flip. Roots are chosen for flipping such that one-half of the passband contains roots inside the unit circle, and the other half contains roots outside (FIG. 2c). This pattern is chosen as it will result in approximately quadratic phase in the spectral window. Multiplying the new roots together gives a non-linear phase beta-polynomial, shown in FIG. 2d.

This sequence of coefficients, p, is then combined with its complex conjugate, â*, in the following manner:

$$\hat{\alpha}_j^{sweep} = e^{-i2\pi y \frac{TB}{4} j} \hat{\alpha}_j + e^{i2\pi y \frac{TB}{4} j} \hat{\alpha}_j^* \text{ where } j = [0, 1, 2, \dots (N-1)]. \quad (2)$$

RF Pulse Generation

This beta-polynomial, $\hat{a}_{sweep}$ (FIG. 2e), together with the beta-polynomial for the spatial dimension, is passed through the inverse 2D SLR transform to compute the RF waveform.

Figure 3:
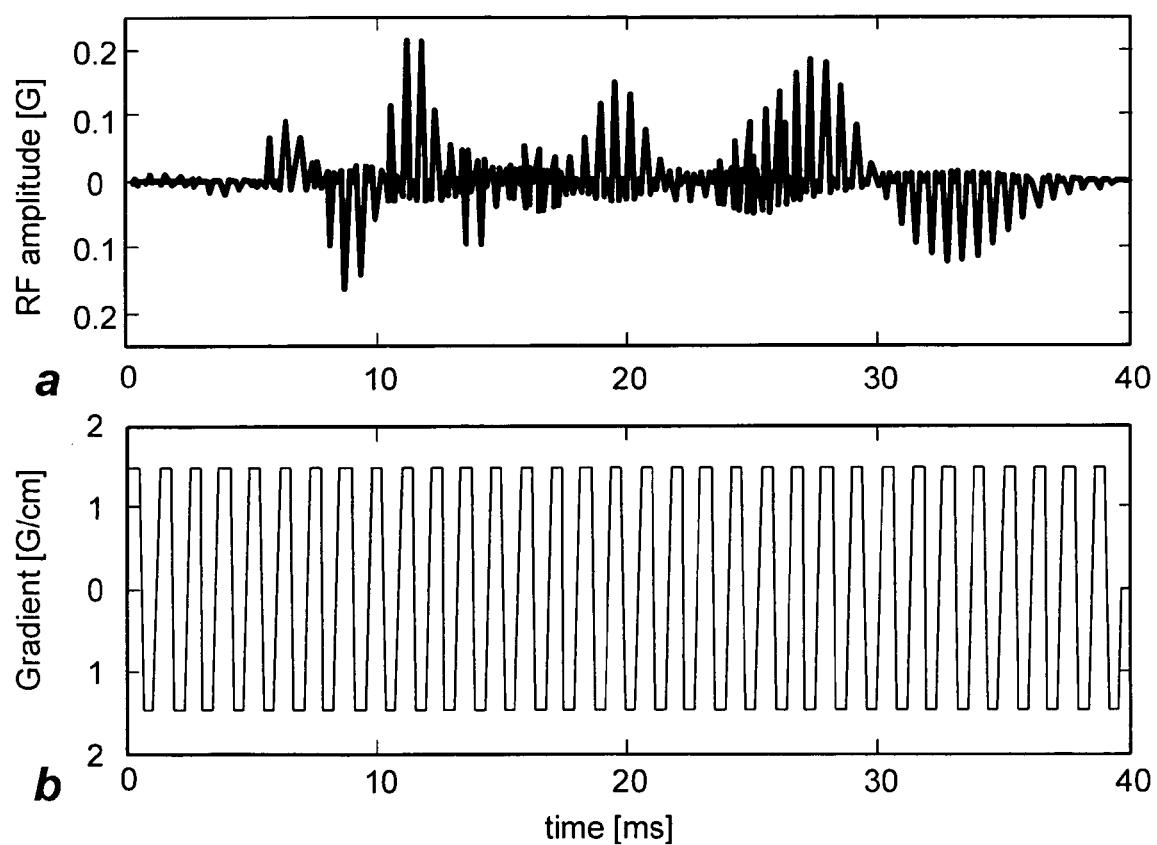
FIGS. 3a–3b illustrate RF and gradient waveforms for lactate editing at 3T.

Shown in FIG. 3 are the RF (a) and gradient (b) waveforms for lactate editing at 3T, resulting from the spectral beta-polynomial shown in FIG. 2e. The sublobes were 600 µs in duration, with 66 sublobes covering the 39.6 ms duration. The oscillating gradient waveform is designed (FIG. 3b) with ramps and amplitude within hardware constraints, and the samples of the RF waveform that are transmitted during the gradient ramps are corrected using the variable-rate selective excitation (VERSE) algorithm.

Pulse, Performance and Refinement

Figure 4:
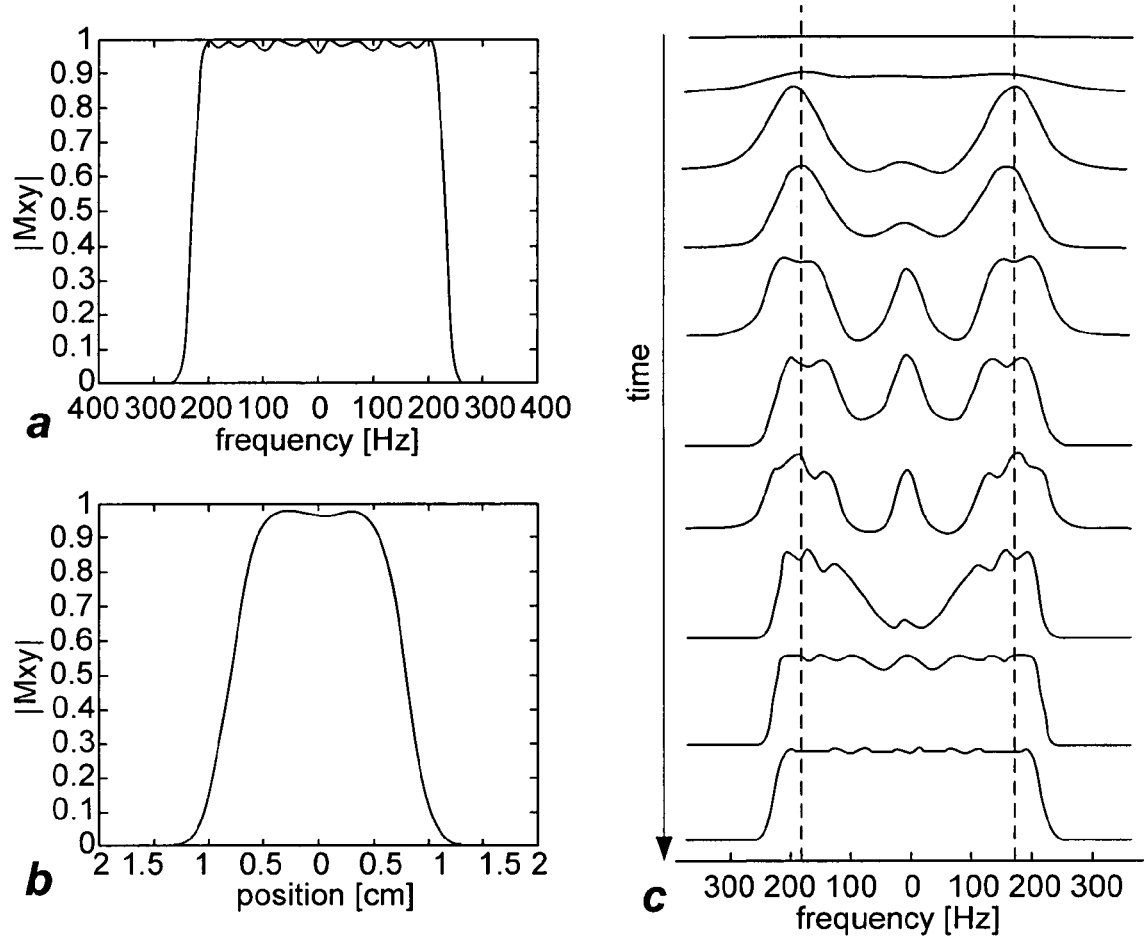
FIGS. 4a–4d illustrate performance of the symmetric sweep RF pulse for lactate editing at 3T.

The performance of the pulse is evaluated using a Bloch-equation simulation. FIG. 4 illustrates performance of the symmetric sweep RF pulse for lactate editing at 3T, shown in FIG. 3. The spectral and spatial selectivity are shown in (a) and (b), respectively. (c) The spectral profile of the pulse is plotted at ten equally spaced intervals (3.96 ms apart) during the pulse. The two dashed lines denote the frequencies of the two components of lactate. The key to the pulse usefulness for editing is that tipping occurs at these two frequencies simultaneously and over a short interval.

The spectral and spatial profiles (FIGS. 4a and 4b) are checked for adequate fidelity. If, for example, the ripples within the spectral passband are too large, the weighting factors for the Parks-McClellan algorithm can be modified and the pulse recomputed. Once satisfactory profiles are obtained, the spectral profile is computed at intermediate time points during the pulse (FIG. 4c). The ideal spectral time-course shows equal flipping occurring at the frequencies corresponding to coupled spins of interest, with this flipping occurring over a short time (a few ms). For example, the two dashed lines in the time-course shown in FIG. 4d denote the frequencies of the coupled components of lactate, at 1.3 and 4.1 ppm.

Altering the spectral time-course of the RF pulse is accomplished by changing the root pattern of the spectral beta-polynomial. The first course of action, which often yields the desired result, is to use the same Parks-McClellan design, but to flip different roots. If this fails, the Parks-McClellan design can be altered slightly, for example by changing the number of samples in the spectral beta-polynomial, yielding a new initial root pattern to work with. Then, all of the steps above must be repeated.

Methods

To test the new RF pulse design method, symmetric sweep pulses were computed for lactate editing at two different field strengths: 1.5T and 3T. Both pulses were designed to refocus a spectral window encompassing the 1.3 ppm to 4.1 ppm components of lactate. An important design criterion was to ensure that when the pulse was centered on this window, the two lactate resonances were affected simultaneously and over a short interval (<<1/J). For the 3T application, the beta-polynomial designed in FIG. 2 was used, along with a spatial beta-polynomial with a time-bandwidth of 6.0, to compute the RF pulse shown in FIG. 3.

Figure 5:
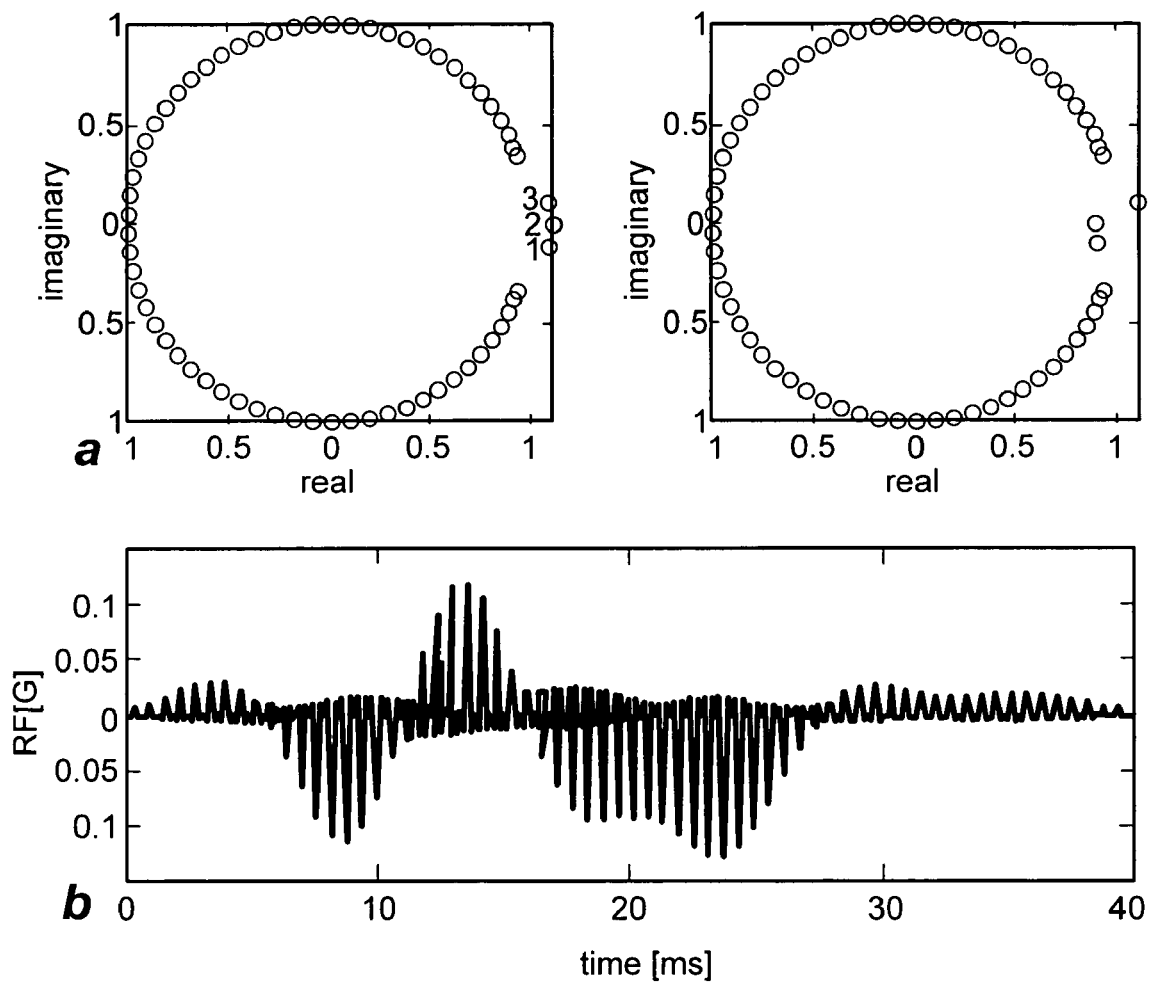
FIGS. 5a–5b illustrate a symmetric sweep RF pulse for lactate editing at 1.5T.

The design of a lactate editing pulse for application at 1.5T proved to be more challenging, because the lower spectral bandwidth resulted in fewer polynomial roots with which to manipulate the refocusing time-course. FIG. 5 illustrates symmetric sweep RF pulse for lactate editing at 1.5T. (a) The root pattern resulting from a minimum phase filter design is manipulated so that one root is outside the unit circle, and two are inside (root numbers 1 and 2 have been flipped). (b) The resulting RF waveform, with sublobes of 600 µs duration. Note that the sublobes are not all the same, which is a consequence of applying the SLR transform in both the spatial and spectral dimensions.

Figure 6:
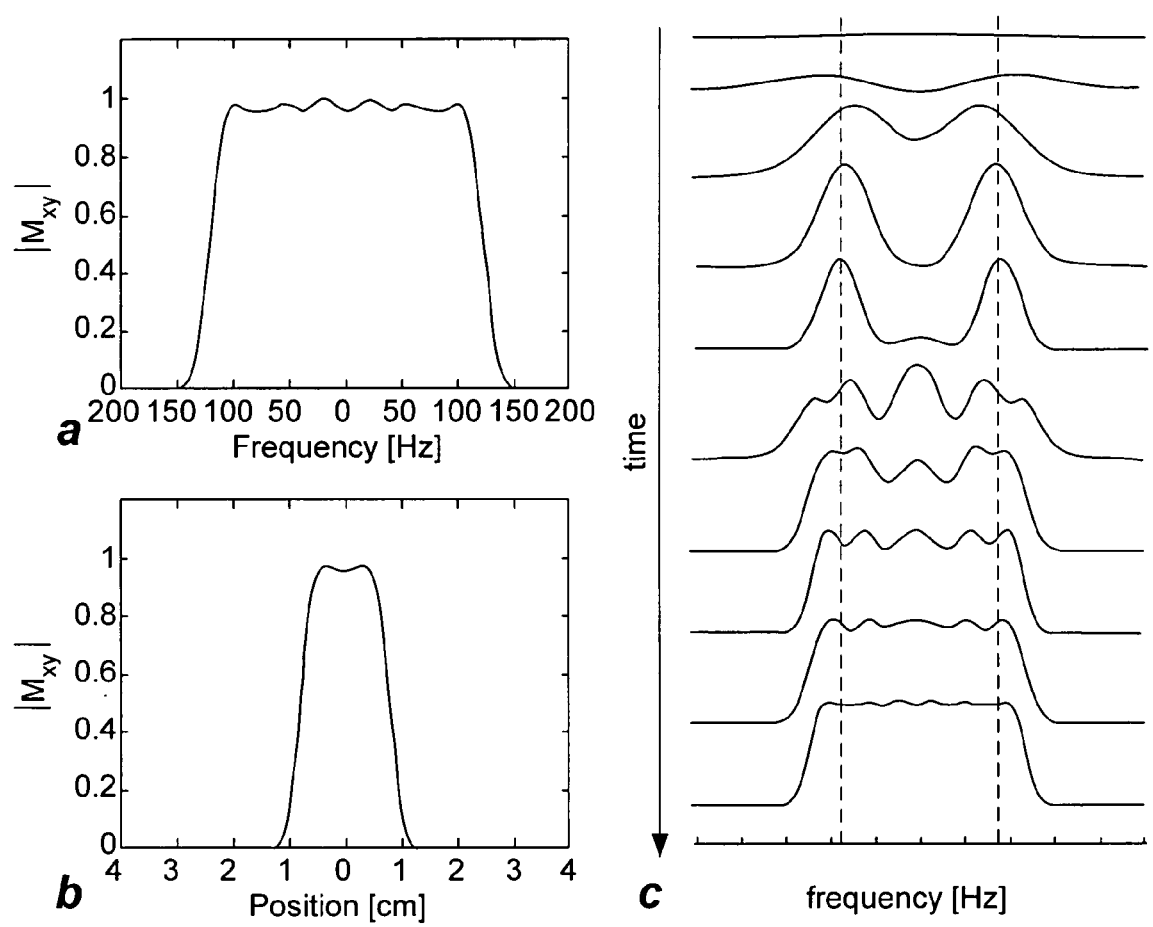
FIGS. 6a–6c illustrate performance of the symmetric sweep RF pulse of FIG. 5.

However, it was found that good results could be obtained by starting with a minimum phase beta-polynomial. FIG. 6 illustrates performance of the symmetric sweep RF pulse for lactate editing at 1.5T, shown in FIG. 5. The spectral profile (a) is not as good as for the 3T pulse of FIG. 4, with the relative width of the transition bands more than twice as wide. The spatial profile is shown in (b), and the time-course of the spectral refocusing in (c), plotted at ten equally spaced intervals (3.96 ms apart) during the pulse. The dashed lines denote the frequencies of the two components of lactate.

These filters have a distinctive root pattern, seen in FIG. 5a, with all passband roots on one side of the unit circle. With the root flipping as shown in FIG. 5 and a spatial time-bandwidth of 6.0, the RF pulse shown in FIG. 5b was computed. With this minimum phase beta-polynomial, it was found that Eq. 2 did not produce good results, and instead a modified version was needed:

$$\hat{\alpha}_j^{sweep} = e^{-i2\pi y \frac{TB}{4} j} \hat{\alpha}_j + e^{i\theta} e^{i2\pi y \frac{TB}{4} j} \hat{\alpha}_j^* \quad (3)$$

with θ manually varied until a good match between the two parts of the spectral profile was obtained.

Figure 7:
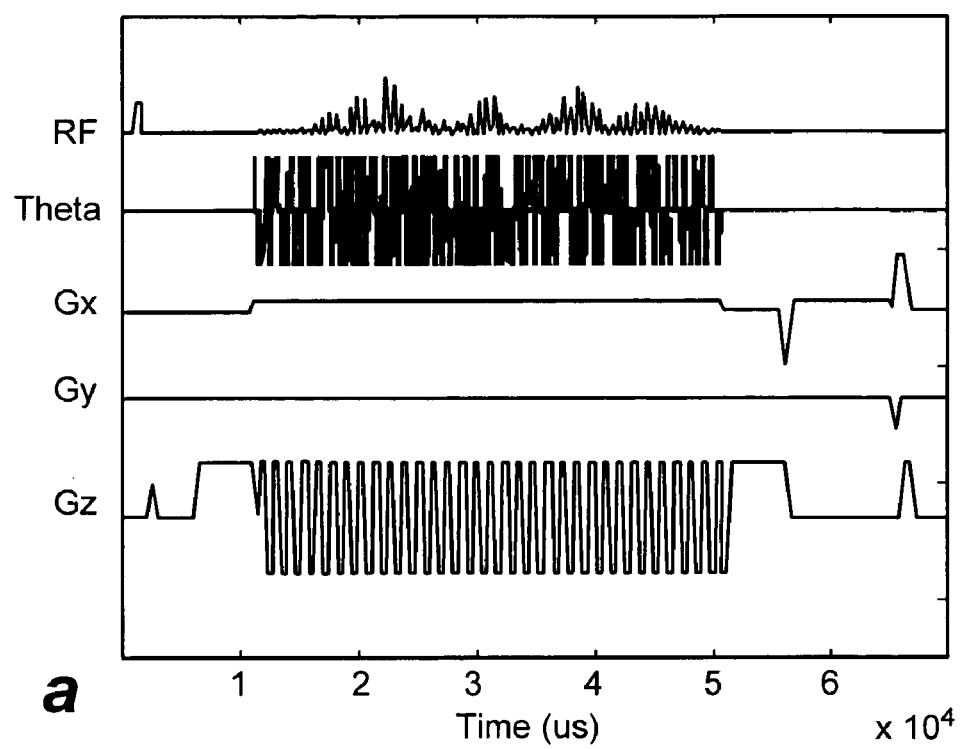
FIGS. 7a–7c illustrate experimental excitation profile measurements including spin-echo pulse sequence and experimental and numerically computed lactate profiles.
Figure 7:
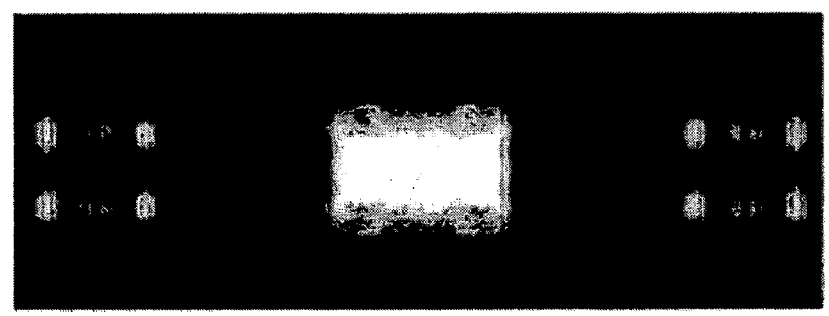
Figure 7:
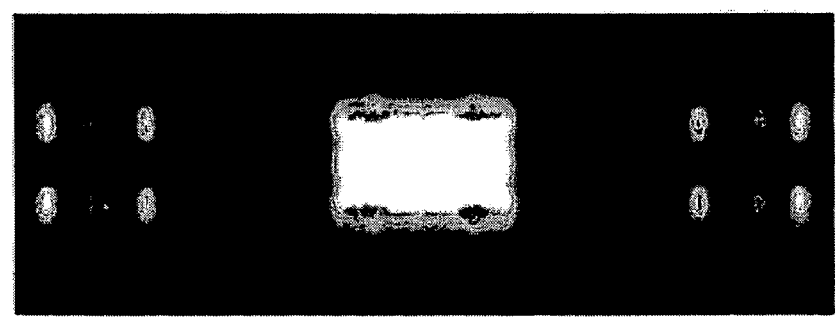

The spin-echo profiles of the symmetric sweep pulses were measured with a phantom experiment using a GE Signa 3T whole-body scanner. FIG. 7 illustrates experimental excitation profile measurements. (a) The spin-echo pulse sequence used to test the spectral-spatial pulses consisted of a non-selective (hard) π/2 pulse and a selective, spectral-spatial π pulse. The lines labeled RF and Theta show the magnitude and phase of the RF pulses, respectively. Note the presence of a gradient during the spectral-spatial pulse to encode the spectral profile of the pulse in the read-out direction. The experimental profiles for the lactate editing pulse for 3T (b) shows excellent agreement with the numerically computed profile (c). Note the bipolar "ghost" profiles (an artifact due to transmission of RF on both positive and negative gradient lobes).

Magnetization was excited with a non-selective 90° pulse in a phantom filled with distilled water doped with copper sulphate, with dimensions 1×12×12 cm³ and T1 and T2 approximately 100 ms. The distribution of magnetization refocused by the new pulses was measured with a modified spin-echo pulse sequence (see FIG. 7a). The spatial variation of the profile was resolved by phase encoding in the through-slice direction, and the spectral variation of the profile was resolved by applying a 0.61 mT/m gradient during application of the SSRF refocusing pulse. Using 256×256 encoding, an 8 cm FOV, TR/TE=300/60 ms and the body coil for both excite and receive, the profile shown in FIG. 7b was measured.

Figure 8:
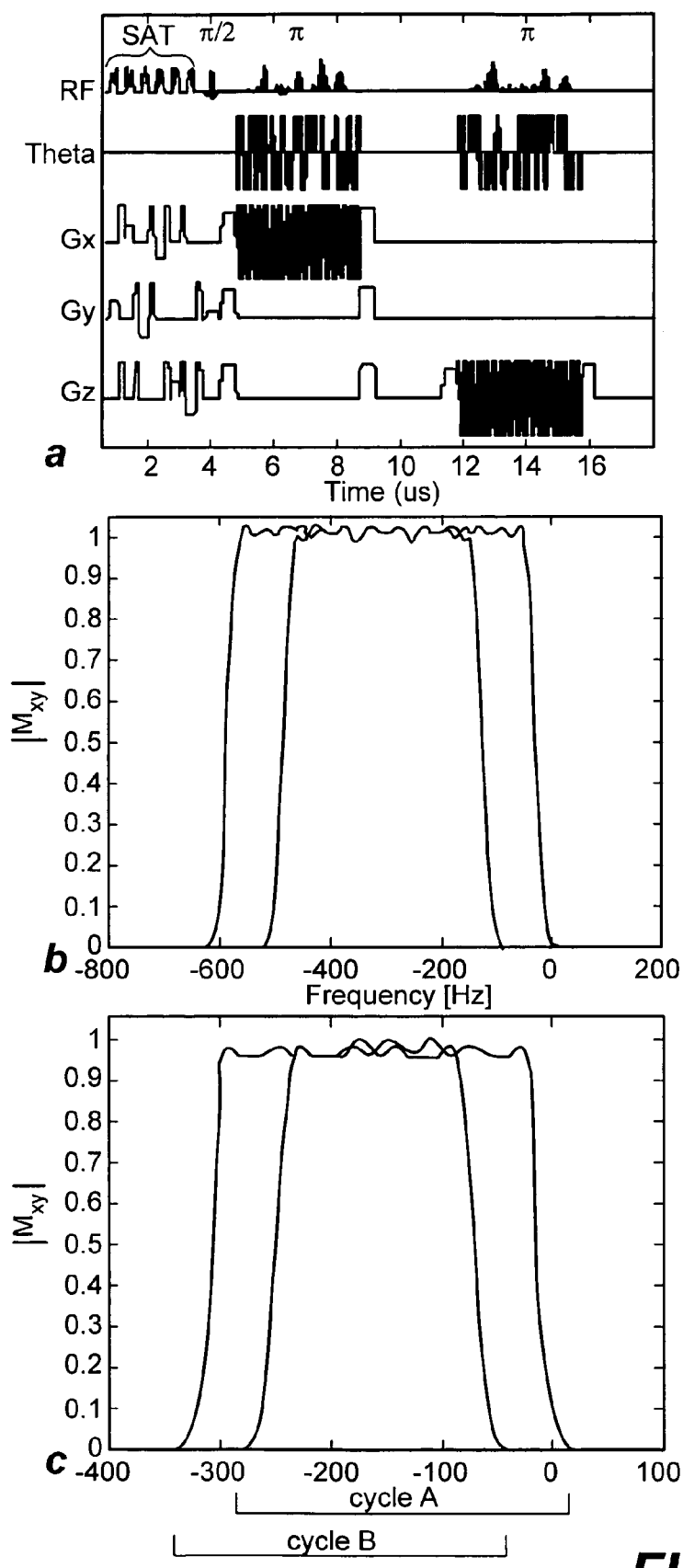
FIGS. 8a–8c illustrate implementation of symmetric sweep RF pulses for testing a phantom including a PRESS and spectral profiles for the two MRI acquisitions.

The new pulses were tested by acquiring MRSI data from phantoms containing metabolites of interest mixed with water. Experiments were performed on the 3T scanner, as well as a GE Signa 1.5T scanner. The pulses were implemented in the PRESS pulse sequence as shown in FIG. 8a. FIG. 8 shows each spectral-spatial implementation of the symmetric sweep RF pulses for testing in a phantom experiment. Each spectral-spatial pulse was inserted in place of the π refocusing pulse in the PRESS sequence (a). The lines labeled RF and Theta show the magnitude and phase of the RF pulses, respectively. In each editing experiment, two acquisitions were performed: cycle A with the spectral profile centered on spectral profile shifted to exclude the 4.1 ppm component. Note that the spectral profile of the 3T pulse (b) is sharp enough that good water suppression can be achieved in both cycles, whereas the 1.5T profile (c) refocuses a significant amount of water in cycle A. The frequencies in the graphs are plotted relative to water at 0 Hz.

The parameters for the acquisition were: 8×8×8 phase encoding with 1 cm³ resolution covering a 6 cm×6 cm×4 cm volume defined by the selective RF pulses, TR=1 s, TE=144 ms, 512 samples per readout with 1 kHz spectral bandwidth. The standard brain spectroscopy phantoms provided with the GE Signa scanners were used (two different phantoms for the two scanners), which contain choline, creatine, N-acetyl aspartate (NAA) and lactate. The editing schemes for the two field strengths are shown in FIG. 8.

The RF pulses designed with the new method are shown in FIG. 3 and FIG. 5. It is interesting to note that the sweep through the spectral dimension is reflected in the appearance of the RF waveforms. The act that the effect of the pulse starts at the outer edges of the spectrum and sweeps inwards is reflected in the higher frequency oscillations of the sublobe amplitudes at the start of the pulse. The spectral sweep caused by the pulses is shown in FIG. 4c and FIG. 6c. Although the pulses are shown to affect the coupled components over a much shorter time than the full duration of the pulse, there is still a transit time of approximately 5 ms. This may explain the imperfect editing quantified below.

The experimentally measured spin-echo profiles seen in FIG. 7 show the spectral and spatial regions refocused by the new pulses. The agreement between the measured and numerically computed profiles show that the hardware is capable of transmitting these challenging waveforms. The variation seen in the spatial slice profile across the main spectral lobe is thought to be cross-talk between the spectral and spatial profiles, due to imperfections in implementation of the inverse 2D SLR transform.

Figure 9:
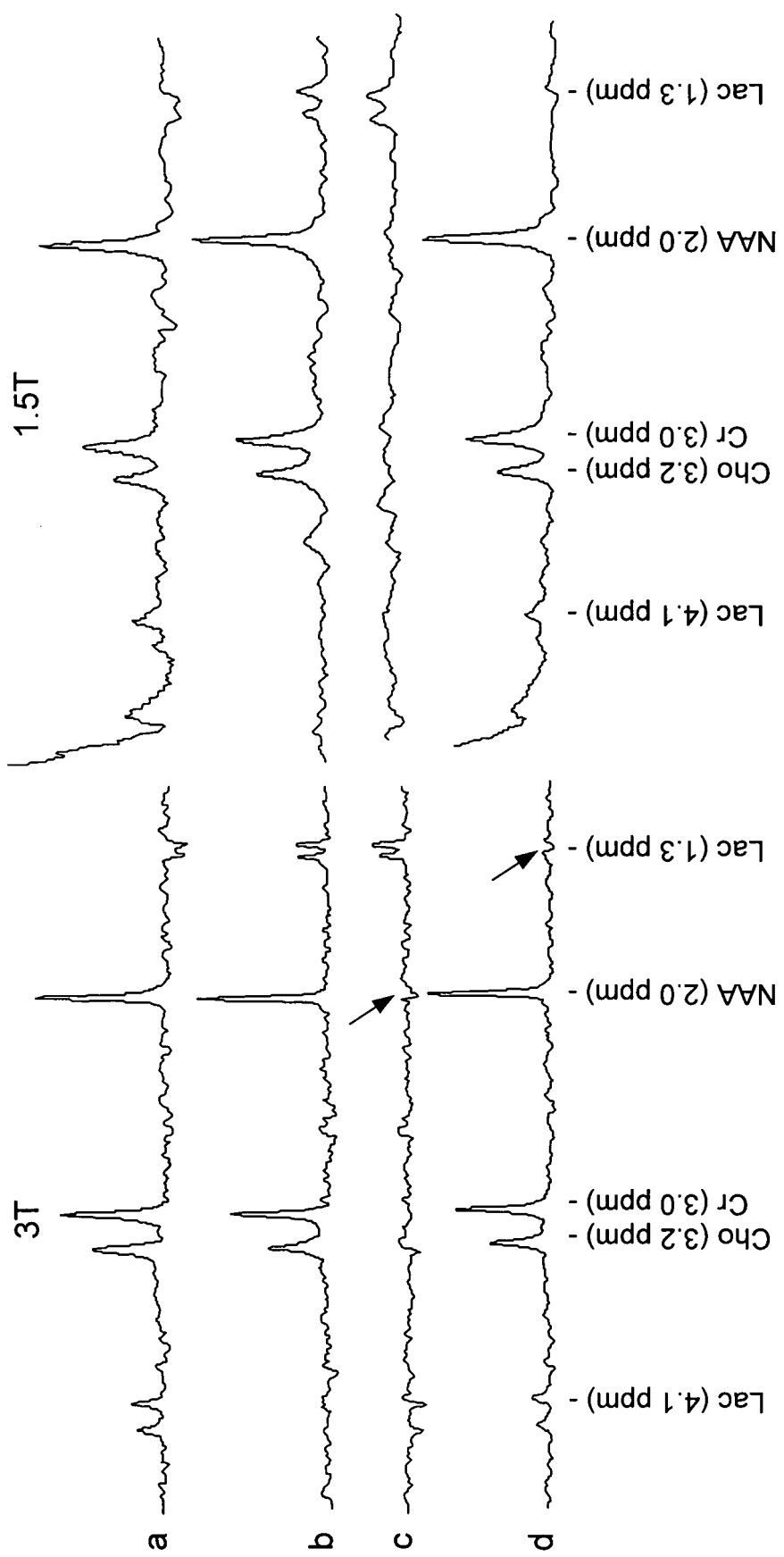
FIGS. 9a–9d illustrate data from a lactate editing experiment using pulses in accordance with the invention at 3T and at 1.5T.

The performance of the new pulses for lactate editing is seen in FIG. 9. Typical spectra data from the lactate editing experiment using the new pulses is shown. Typical spectra acquired with (a) both 1.3 ppm and 4.1 ppm components refocused and (b) 4.1 ppm component excluded are shown. The difference of the two spectra (c) shows a resolved lactate doublet at 1.3 ppm, but with some leakage of other metabolites (arrows). Conversely, the sum of the two spectra (d) show well-resolved peaks from choline (3.2 ppm), creatine (3.0 ppm) and NAA (2.0 ppm), but with some leakage of the edited lactate doublet (1.3 ppm). Note that at 3T complete water suppression is achieved in both cycles, but not at 1.5T.

When the spectral profile of the pulse covers both the 4.1 ppm and 1.3 ppm components of lactate, an inversion of the doublet occurs at the echo time 144 ms (1/(2J)). However, this inversion is not complete, as evident in FIG. 9d where residual lactate is seen in the summed spectra. In the subtracted spectra (FIG. 9c), residual signal from uncoupled spins (choline, NAA, etc.) is seen. This is presumably due to the ripples in the spectral profile of the pulses causing the signal to vary by as much as 5% between acquisitions. Although care was taken to align the ripples as much as possible (see FIG. 8a), some leakage due to ripples is likely a fundamental limitation of this method.

In order to verify the functionality of this editing scheme, the relative height of the lactate peak was quantified. From each data set, a group of 32 voxels in a central region was selected (every voxel at least 1 cm away from the edge of refocused volume). The ratio of peak heights between lactate and NAA was calculated for each voxel. For testing the editing, the lactate peak height was determined from the subtracted spectra (e.g., FIG. 9c) and the NSS height from the summed spectra (e.g., FIG. 9d). As a control, the ratio of lactate to NAA was also computed from the "cycle B" spectra (e.g., FIG. 9b), because in this cycle there is no modulation from the 4.1 ppm component and the relative height of lactate should be accurate to within the error caused by the ripple (~5%). For the experiment at 3T the editing gave a mean lactate/NAA ratio of 0.174±0.025, and the control gave 0.191±0.024. This experiment suggests that use of the 3T pulse gave a 93% editing efficiency, and the 1.5T pulse gave a 91% editing efficiency. This is consistent with the appearance of the residual lactate in FIG. 9d.

Figure 10:
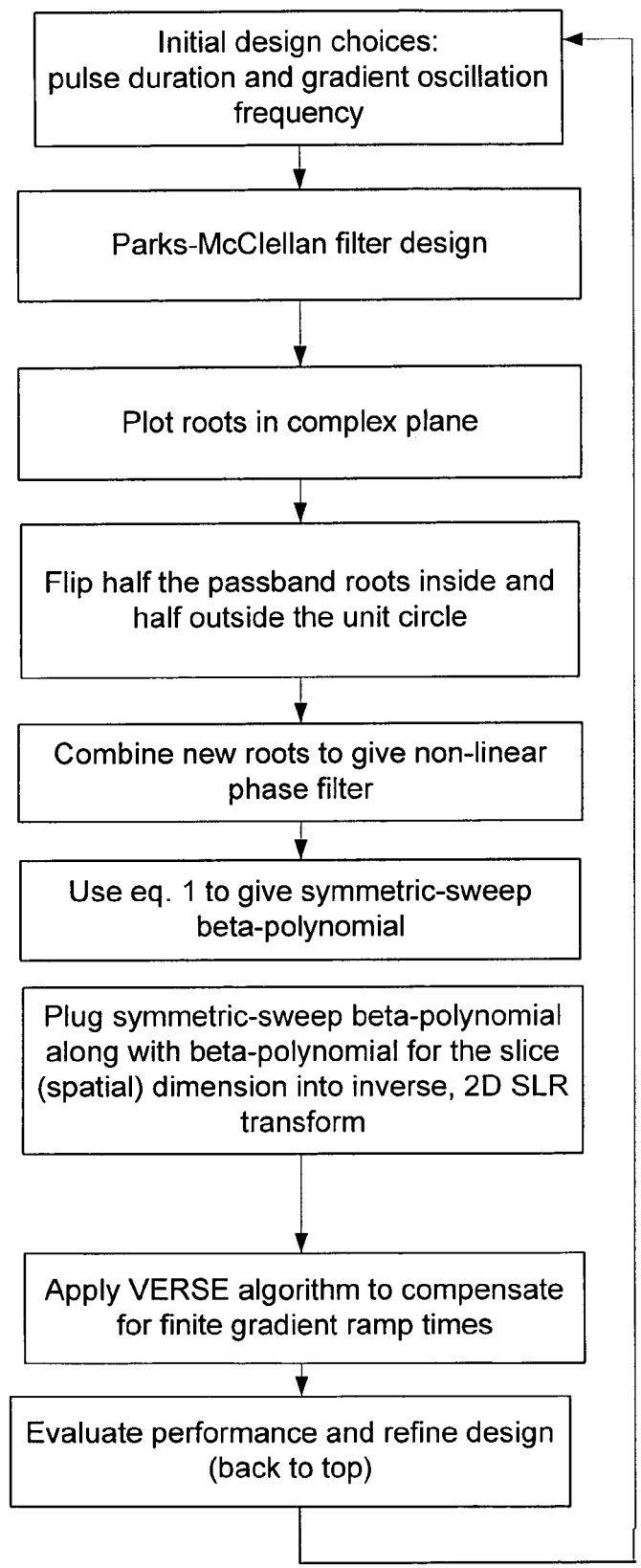
FIG. 10 is a flow diagram of the spectral-spatial RF pulse design in accordance with an embodiment of the invention.

There have been described a new method for generating spectral-spatial 180° RF pulses for editing coupled spins which is summarized in the flow diagram of FIG. 10. The main feature of the new pulses is that the spectral window is refocused in a symmetric sweep, from the outer edges of the window inwards, enabling the simultaneous refocusing of coupled spins. Also, the phase profile of the spectral window is non-linear, and the resulting savings in RF amplitude can be spent on high bandwidth in the spatial dimension (10 kHz), minimizing the spatial offsets between different resonances. Phantom studies showed that lactate editing is feasible using the new pulses, with a 91%–93% editing efficiency. The performance of these two pulses in vivo is currently being investigated.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method for designing symmetric-sweep spectral-spatial RF pulses comprising the steps of:
   a) specifying a pulse duration and gradient oscillation frequency for the RF pulse,
   b) designing a beta-polynomial for a spectral dimension of the RF pulse,
   c) altering polynomial roots of the spectral linear-phase beta-polynomial as plotted in the complex plane,
   d) computing a non-linear phase beta-polynomial using the altered roots, and
   e) computing a symmetric sweep beta-polynomial RF pulse from the non-linear phase beta-polynomial.

2. The method as defined by claim 1 wherein step a) determines the number of sub-lobes, the number of beta-polynomial coefficients for the spectral dimension (N), and a time-bandwidth product for the spectral dimension (TB) based on spectral bandwidth and pulse duration.

3. The method as defined by claim 2 wherein step b) uses number of coefficients (N), time-bandwidth product (TB), and weighting factors for in-band and out-of-band ripple optimization.

4. The method as defined by claim 3 wherein step b) uses a Parks-McClellan digital filter design algorithm.

5. The method as defined by claim 4 wherein step c) flips approximately half of the roots of the passband inside the unit circle and flips the other half of the roots of the passband outside of the unit circle.

6. The method as defined by claim 5 wherein in step c) the roots are altered such that one-half of the passband contains roots inside the unit circle, and the other half of the passband contains roots outside the unit circle.

7. The method as defined by claim 4 and further including:
   f) repeating steps b)–e) after altering weighting factors in step b) to improve pulse performance.

8. The method as defined by claim 4 and further including:
   f) repeating steps b)–e) after changing the root pattern of the spectral beta-polynomial in step c) to improve pulse performance.

9. The method as defined by claim 4 and further including:
   f) repeating steps b)–e) after altering pulse duration or gradient oscillation frequency in step a) to improve pulse performance.

10. The method as defined by claim 4 wherein the RF pulse is designed for use in magnetic resonance spectroscopic imaging.

11. The method as defined by claim 10 wherein the RF pulse is designed for use in spatially resolved measurement of metabolite levels.

12. The method as defined by claim 11 wherein the metabolite is lactate.

13. The method as defined by claim 1 wherein the RF pulse is designed for use in magnetic resonance spectroscopic imaging.

14. The method as defined by claim 13 wherein the RF pulse is designed for use in spatially resolved measurement of metabolite levels.

15. The method as defined by claim 14 wherein the metabolite is lactate.

* * * * *